(12) United States Patent
Clauvelin et al.

(10) Patent No.: US 10,852,332 B2
(45) Date of Patent: Dec. 1, 2020

(54) ISOLATION MONITORING DEVICE AND METHOD

(71) Applicant: Sendyne Corporation, New York, NY (US)

(72) Inventors: Nicolas Clauvelin, New York, NY (US); Victor Marten, Flushing, NY (US); Ioannis Milios, New York, NY (US)

(73) Assignee: Sendyne Corporation, New York, NY (US)

( * ) Notice: Subject to any disclaimer, the term of this patent is extended or adjusted under 35 U.S.C. 154(b) by 0 days.

(21) Appl. No.: 16/262,323

(22) Filed: Jan. 30, 2019

(65) Prior Publication Data

US 2019/0242932 A1 Aug. 8, 2019

Related U.S. Application Data

(63) Continuation of application No. 15/747,115, filed as application No. PCT/IB2017/056746 on Oct. 31, 2017, now abandoned.

(Continued)

(51) Int. Cl.
| | |
|---|---|
| *G01R 27/02* | (2006.01) |
| *G01R 31/00* | (2006.01) |
| *B60L 3/00* | (2019.01) |
| *G01R 31/50* | (2020.01) |
| *G01R 27/18* | (2006.01) |

(52) U.S. Cl.
CPC .......... *G01R 27/025* (2013.01); *B60L 3/0046* (2013.01); *B60L 3/0069* (2013.01); *G01R 27/18* (2013.01); *G01R 31/007* (2013.01); *G01R 31/50* (2020.01)

(58) Field of Classification Search
None
See application file for complete search history.

(56) References Cited

U.S. PATENT DOCUMENTS 8,598,897 B2  12/2013  Nalbant
8,878,547 B2  11/2014  Herraiz
(Continued)

OTHER PUBLICATIONS

International Search Report in International Application No. PCT/IB2017/056746, dated Jan. 23, 2018.
(Continued)

*Primary Examiner* — Douglas X Rodriguez
(74) *Attorney, Agent, or Firm* — Oppedahl Patent Law Firm LLC

(57) ABSTRACT

Wide deployment of high voltage battery systems in traction, industrial and renewable energy installations is raising the concerns for human safety. Exposure to hazardous high voltages may occur due to deterioration of insulation materials or by accidental events. It is thus important to monitor for such faults and being able to provide timely warnings to affected persons. For this purpose it has become mandatory for electrified passenger vehicles (CFR 571.305) to maintain high isolation values which can be continuously monitored by electrical isolation monitoring devices. The task of monitoring isolation resistance within the electrically noisy car environment is not a trivial task and the solution to this problem has become quickly a field of research and innovation for all affected industries.

34 Claims, 11 Drawing Sheets

Related U.S. Application Data

(60) Provisional application No. 62/452,966, filed on Jan. 31, 2017, provisional application No. 62/436,350, filed on Dec. 19, 2016, provisional application No. 62/436,358, filed on Dec. 19, 2016.

(56) References Cited

U.S. PATENT DOCUMENTS

| | | | |
|---|---|---|---|
| 9,046,559 B2 | 6/2015 | Lindsay | |
| 2008/0119976 A1* | 5/2008 | Tarchinski | G01R 27/025 701/22 |
| 2010/0244850 A1 | 9/2010 | Yano | |
| 2011/0304339 A1* | 12/2011 | Schumacher | G01R 31/52 324/509 |
| 2015/0276846 A1* | 10/2015 | Paris | G01R 27/025 702/65 |
| 2016/0164309 A1* | 6/2016 | Bonafe' | B60L 3/0046 320/167 |
| 2016/0334452 A1 | 11/2016 | Mensler | |
| 2017/0176509 A1* | 6/2017 | Schulz | G01R 31/007 |

OTHER PUBLICATIONS

Written Opinion of the International Searching Authority in International Application No. PCT/IB2017/056746, dated Jan. 23, 2018.

* cited by examiner

Fig. 1A
Prior art
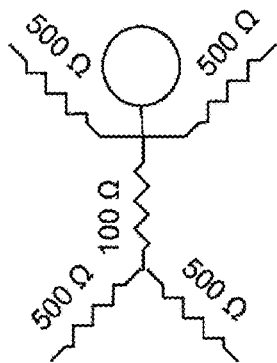
Fig. 1B
Prior art
| Current (mA) | Effects |
|---|---|
| <1 | No sensation |
| 1-3 | Mild sensation, no pain |
| 3-10 | Muscle clamping |
| 30-75 | Respiratory paralysis |
| 75- 4000 | Ventricular fibrilation |
| >4000 | Tissue burning. Heart stops. |
Fig. 2
Prior art
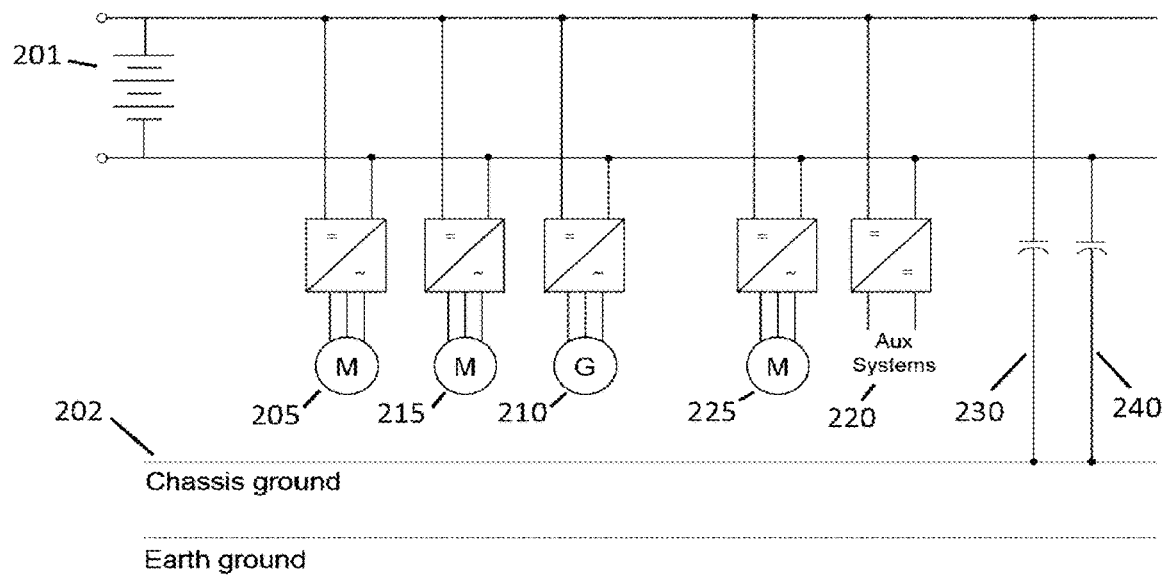

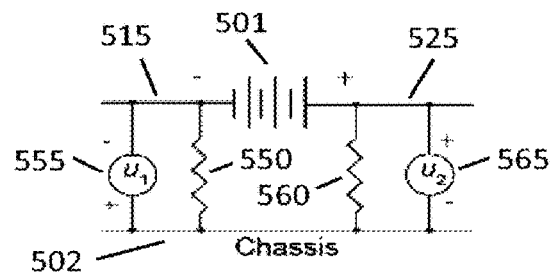
Fig. 5A
Prior art
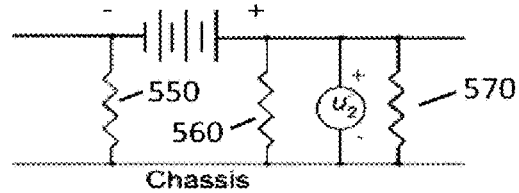
Fig. 5B
Prior art
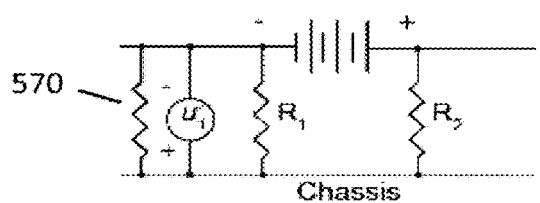
Fig. 5C
Prior art
Fig. 6A
Prior art
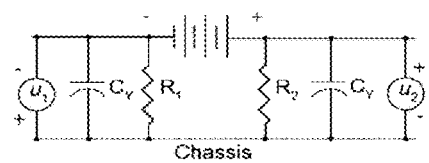
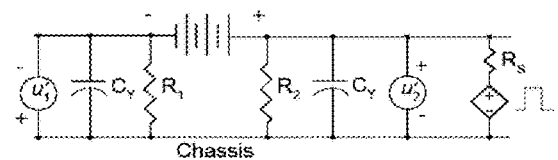
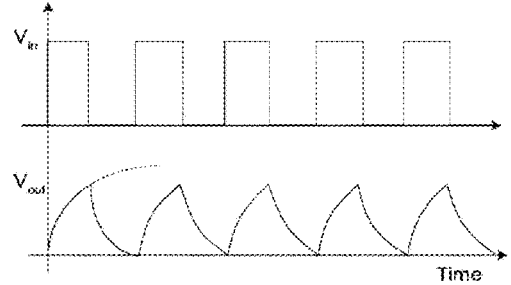
Fig. 6B
Prior art
Fig. 6C
Prior art Fig. 7
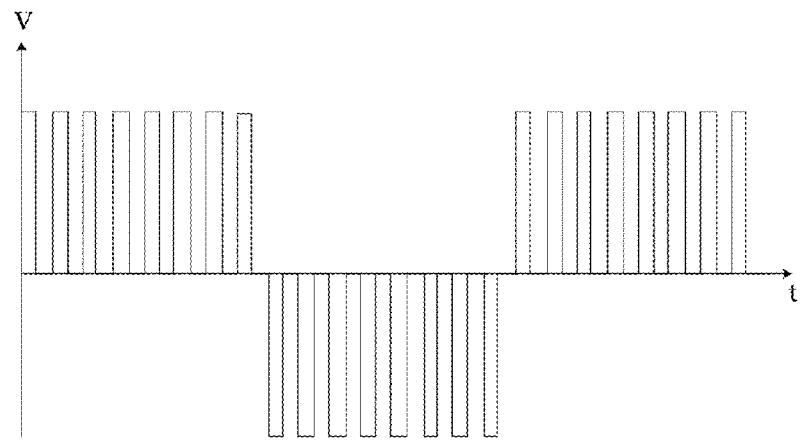
Fig. 8A
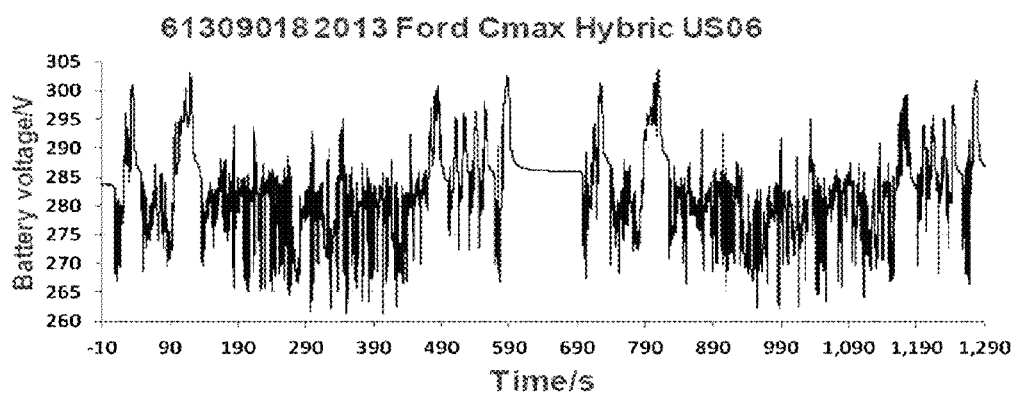
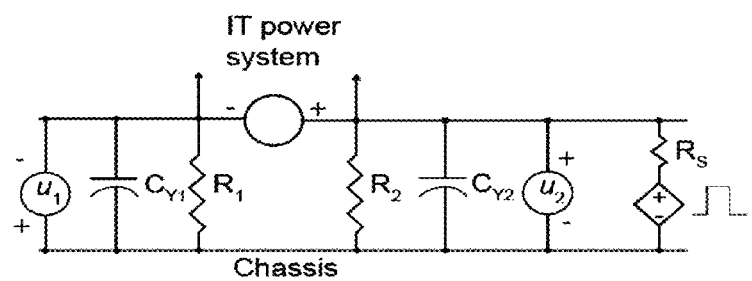
Fig. 8B

ISOLATION MONITORING DEVICE AND METHOD

BACKGROUND OF THE INVENTION

Wide deployment of high voltage battery systems in traction, industrial and renewable energy installations is raising the concerns for human safety. Exposure to hazardous high voltages may occur due to deterioration of insulation materials or by accidental events. It is thus important to monitor for such faults and being able to provide timely warnings to affected persons. For this purpose it has become mandatory for electrified passenger vehicles (CFR 571.305) to maintain high isolation values which can be continuously monitored by electrical isolation monitoring devices. The task of monitoring isolation resistance within the electrically noisy car environment is not a trivial task and the solution to this problem has become quickly a field of research and innovation for all affected industries.

The function of the isolation monitoring device is to determine the value of the isolation resistance between either of the battery terminals and the chassis. Furthermore it must issue an alarm if the isolation resistance becomes lower than a certain value. This value is determined by the human body tolerance to electrical current. The table of FIG. 1 shows typical human body reaction to current passing through the body. The resistance values shown for the different paths in the human body are typical and can vary widely based on the condition of the skin and other factors. Nevertheless, one may notice that the order of magnitude of resistances is relatively small.

When an electrical system is not connected to the Earth, as in the case of an electrical vehicle, the system is said to have a "floating" ground. The abbreviation IT comes from the French term "isolé terre" (isolated earth) and it is used by IEC (International Electrotechnical Commission) to describe a power system with "floating" ground. FIG. 2 shows such a system as it is implemented in an electrified vehicle.

In this system, the high voltage battery and all the car systems connected to it are isolated from the Chassis ground which consists of the metal body of the car that passengers come in constant contact with. The battery of an electric vehicle is connected through DC to AC converters to motors, generators, which are typically the same motors acting as generators when the car is decelerating or moving downhill, and the various car auxiliary systems through DC to DC converters. The two capacitors shown on the right represent either capacitors placed with the purpose of reducing EMI (electromagnetic interference) noise or the small parasitic capacitances that exist in any electrical system.

This type of grounding serves an important purpose for the safety of a car and those in contact with it. If for example the negative of the battery was connected to the Chassis, and an isolation fault occurred to one of the positive cables, an immediate short would be created at the battery terminals causing fuses to blow. This could result in immediate loss of power in the electric vehicle—including loss of braking power—which could result in accidents or other problems.

In contrast, in an IT power system as shown in FIG. 3, a single isolation fault 340 would not cause an immediate power failure. It also would not cause any danger for the car passengers, as long as they don't touch the unaffected terminal which is shielded from passenger access. Instead the driver will receive a warning and will then be able to drive the car safely and in full capacity to a service location. In case of an accident, which may cause itself an isolation fault, the emergency first responders will be warned to take safety precautions and to avoid touching affected parts of the automobile.

An isolation fault may also occur through excessive deterioration of insulating materials resulting from extreme hot-cold cycles, by sparks and other electrical hazards or even by rodents.

To address these potential risks, the National Highway Traffic Safety Administration (NHTSA) of the Department of Transportation (DOT) issued a final rule amending the electrical shock protection requirements of Federal Motor Vehicle Safety Standard No. 305 (49 CFR 571.305), which mandates for a DC voltage system a minimum number of ohms/volt of isolation of a high voltage source. In essence it specifies the maximum current that can pass through the isolation resistance path, which cannot be more than 2 mA without an isolation monitoring device (500 ohm/volt) or 10 mA with one (100 ohm/volt). As an example, for a DC voltage source of 400 volts with isolation monitoring, the specification is 100 ohm/volt. This translates into a minimum isolation resistance of 40 kilohms. Without isolation monitoring the minimum value for the same system would be 200 kilohms.

The difference between the allowed values of ohms/volt depending on whether an isolation monitoring device is present can be appreciated by understanding the absence of one. If there is no isolation monitoring device, the isolation resistance can be measured only during scheduled service of the vehicle. The only method the vehicle manufacturer has to ensure conformance in this case is by using highly rated materials and wiring protection and hoping that isolation faults will only happen gradually and will be discovered during scheduled inspections. An isolation monitoring device, in contrast, operates all of the time making it the preferred method for future vehicle builds.

One can see the impact of these specifications by looking again at FIG. 3. The isolation fault 340 would be the isolation resistance (40 kilohm or 200 kilohm). The connection 315 would be the resistance path of a human body touching the other terminal. There would be a closed electrical circuit through the battery and the chassis with the isolation resistance dominating the current value as it is much higher than the human body resistance. At the limit of 40 kilohms, the person touching the positive terminal would still be safe albeit lightly shocked.

Together with establishing these requirements, the CFR 571.305 safety standard specifies a method for calculating the isolation resistance. Referred to as the "voltage" method and prescribed for use in vehicle service stations, the method will be described in more detail below. Some improvements to this "voltage" method also exist, about which more will be said below.

The "Voltage" Method

In the drawings of FIG. 5 the resistances 550 and 560 represent the isolation resistances between the negative and the positive battery terminals to the chassis. Two voltmeters measure the corresponding voltages U1 and U2. If there is a difference on the readings, a known resistance 570 is connected to the side with the higher voltage reading and using Ohm's law the smaller isolation resistance is calculated. This method is referred to as the "voltage" method and it is prescribed for use in vehicle service stations. Although simple and straightforward the method has serious drawbacks that limit its efficiency when used continuously in an operating vehicle.

First, the insertion of a resistance in the isolation path may adversely affect the isolation of the IT system. This is because resistor 570 cannot have an arbitrarily high value as the method relies on its effect upon the measured voltage. The measurement method itself may jeopardize isolation. Also, switching loads on and off in a high voltage system requires expensive components. The measurement assumes that the battery voltage remains constant during successive measurements. In an operating vehicle this condition is rarely true (less than 20% of operating time).

U.S. Pat. No. 9,322,867 presents a variation of the method which overcomes the issue of the negative impact of resistor 570 by using instead different types of current limiting devices. The issues of high cost of high voltage switching and the battery noise impact still remain unaddressed.

The "Pulse" Method

The pulse method is overcoming some of the problems associated with the "voltage" method by injecting a pulse into the DC network as shown in FIG. 6.

Variations of this method are well known and referenced at EP 0 654 673 B1, EP 1 586 910 B1 and DE 101 06 200 C1. The main shortcomings of this method are:
- The accuracy of the method is susceptible to disturbances on the DC lines which typically occur when the vehicle or system is operating.
- As a result a large number of measurements have to be taken until reliable values are obtained.

The "Frequency" Method

A variation of the "pulse" method is the "frequency" injection method (U.S. Pat. Nos. 5,450,328, 9,069,025 B2). In this method an AC signal of known frequency is injected or superimposed on the DC pulse. Through band-pass and low-pass filtering of the resulting signal, the values of impedance and resistance are estimated using digital signal processing techniques.

The method requires digital signal processing capabilities for digital filter implementation as well as the DFT/FFT processing of the monitored responses. The accuracy also is affected by dynamic changes in the load and achieves an acceptable level of accuracy when load changes are small.

Characteristics of a "Good" Isolation Monitoring Device

Based on the analysis of the issues with prior art, it is desirable for an isolation monitoring method to possess the following characteristics:
- The method should not introduce isolation hazards during measurement; neither should it drain significantly the battery during continuous operation.
- It should provide information not only for the isolation resistance but also for the isolation capacitance which can also become hazardous under certain conditions.
- The method should be accurate not only in periods of system inactivity but under all operating conditions
- The method should not produce "false alarms".
- It should be fast and continuously updated. Ideally it should be able to detect intermittent isolation faults.

SUMMARY OF THE INVENTION

The Method According to the Invention

The methods described so far are deterministic relying on a unique known input (pulse, frequency, etc.) to produce an output that can uniquely identify the unknown parameters of resistance and capacitance. These methods are simple but fail in most instances when the varying power load signal interferes.

Using the Power Load Signal as Excitation Source

It is beneficial for safety to be able to accurately determine the isolation resistance and capacitance when the power system is active. In the case of an electrified vehicle this would correspond to 80% of the time the vehicle is in use.

The disclosed method uses these widely varying load signals that naturally occur in an IT power system to identify the isolation parameters. As a result, accurate information on the isolation condition can be derived most of the time the system is operational. An auxiliary excitation signal is used in periods of system inactivity in order to ensure 100% monitoring availability.

Method to Estimate the Element Values of the Isolation Path

According to this method, a model is used to represent the IT power system along with the isolation resistances and capacitances between the IT power system and the chassis ground. The objective is to determine the values of the unknown resistive and capacitive isolation paths between the IT power system and the chassis ground. As shown in FIG. 6A and FIG. 6B those isolation paths can be modeled as parallel RC circuits. Below, we will denote $R_1$ and $C_{Y1}$ the resistor and capacitor in the RC circuit for the isolation path on the negative side of the battery, and $R_2$ and $C_{Y2}$ those for the isolation path on the positive side of the battery.

The method of determining the values of $R_1$, $R_2$, $C_{Y1}$ and $C_{Y2}$ comprises:
- Measuring a first value of voltages $U_1$ and $U_2$ associated with the isolation path between the IT system and the ground chassis
- Measuring a second value of voltages $U_1'$ and $U_2'$ associated with the isolation paths between the IT power system and the ground chassis
- Estimating the values for the model resistors $R_1$, $R_2$ and capacitors $C_{Y1}$ and $C_{Y2}$ associated with the measurements $U_1$, $U_2$, $U_1'$ and $U_2'$ through a function that minimizes the discrepancy between the measurements and a theoretical model for the RC circuits describing the isolation paths
- Accepting the estimated values of each of $R_1$, $R_2$, $C_{Y1}$ and $C_{Y2}$ of the isolation circuit model as the present value estimate and storing it in a storage medium.

It should be appreciated that this method can utilize the varying voltage of the IT power system as the measurement signal for performing the calculations. If the voltage of the IT power system is idle a voltage signal source can be used instead.

The function of minimizing the deviation between the voltage measurements and the theoretical model for the RC circuits describing the isolation paths can be a least-square error estimate performed over a predetermined number of voltage measurements.

An improvement on the method can be achieved by utilizing a stochastic filter, such as a Kalman filter, to minimize the measurement and model noise.

The combined method consists of two steps:
1. at first, a fixed number of measurements for the voltages at the battery terminals and the excitation voltage are collected and used as inputs for a least-square estimator which produces estimates of the isolation parameters (i.e., leakage resistors and leakage capacitors) together with uncertainties for those estimates,
2. the next step is a filtering step implemented using a Kalman filter and designed to maintain the most likely values for the isolation parameters with associated uncertainties by using the results of the least-square estimator in time.

More details on those two steps are given below.

Isolation Parameters Prediction Using a Least-Square Estimator

During operation of the monitoring system, measurements are collected for the values of the voltages at the battery terminals and of the excitation voltage. The purpose of the least-square estimator is to minimize the discrepancy between the measurements and a theoretical model for the isolation paths modeled as RC circuits, the latter expressing the conservation of charge in the monitoring circuit. The least-square estimator therefore receives as inputs a buffer containing a fixed number of the aforementioned voltage measurements and produces as outputs predictions for the isolation parameters, together with uncertainties for those predictions. The predictions are expressed as a vector whose components represent the isolation parameters, and the uncertainties are expressed as a covariance matrix for this vector. It follows that, as the monitoring system is operated, the least-square estimator can be used at any time to provide a prediction of the current isolation parameters vector and the associated uncertainties. In the proposed method, the estimator is used to regularly produce new predictions and uncertainties which are then passed on to the filter described below. The number of voltage measurements as inputs for the least-square estimator can be predetermined or adjusted dynamically depending on the conditions of operation.

Filtering of Predictions for Isolation Parameters Using a Kalman Filter

It follows from the previous section that the monitoring device uses the least-square estimator to obtain predictions and uncertainties for the isolation parameters as a function of time. That is, as the monitoring device is operated, time series of predictions and uncertainties are generated by the least-square estimator. Those time series can be seen as a stochastic process in itself since the measured data sent to the least-square estimator are themselves originating from a stochastic process. Therefore, the purpose of the filter is to maintain estimates for the most likely values for the isolation parameters vector and the associated uncertainties. This is achieved by using a Kalman filter implementation in which the results from the least-square estimator are assimilated to noisy measurements of the isolation parameters. The filter receives as inputs the previous estimates for the most likely values of the isolation parameters and the associated uncertainties, and predictions from the least square estimator. The outputs are new estimates for most likely values of the isolation parameters and the associated uncertainties.

Experimental Results

Experimental results are provided in FIGS. 12-16 based on the apparatus shown in FIG. 8B to FIG. 10 and FIG. 17. The load profile used was based on city driving data measured on a BMW i3 model. The load profile was accelerated 4 times in order to test the algorithms in more adverse load conditions. Measured data along with the produced estimates are provided in FIGS. 12-16.

BRIEF DESCRIPTION OF THE DRAWINGS

FIG. 1A is a diagram of electrical current paths through a human body and each path's approximate value of resistance.

FIG. 1B is a table of biological effects upon the human body of electrical currents.

FIG. 2 illustrates an IT grounding system of an electric vehicle.

FIGS. 5A-5C show the "voltage method" for determining isolation resistance.

FIGS. 6A-6C show the "pulse method" improvement of injecting pulses into the DC network.

FIG. 7 shows superposition of an injected AC signal on a DC pulse in a network according to the "frequency method."

FIG. 8A shows the variation of battery voltage possible during operation of an electric vehicle.

FIG. 8B shows a model as used to represent the IT power system along with the isolation resistances and capacitances between the IT power system and the chassis ground.

DETAILED DESCRIPTION

Figure 3:
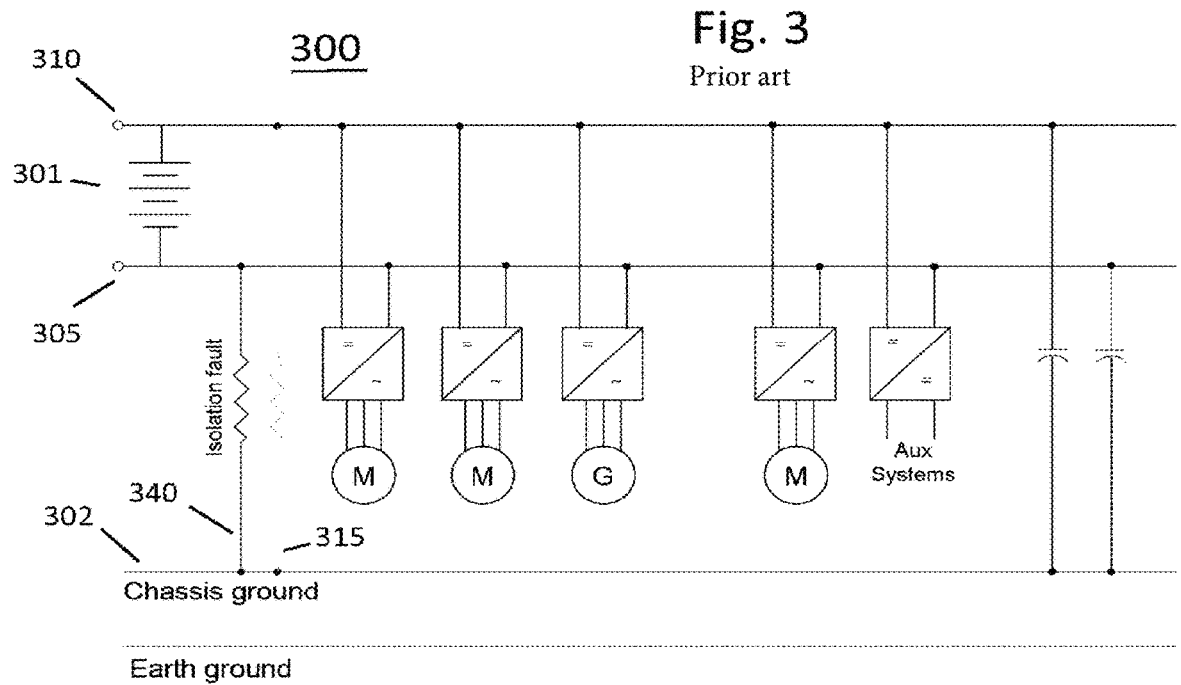
FIG. 3 illustrates an IT grounding system with a single isolation fault.

When a human body contacts two points of non-identical electrical potential, an electric current may flow through the path between the points. Approximate values for each of these paths through the human body are shown in FIG. 1A and the table in FIG. 1B shows typical reactions in the human body for given amounts of electric current.

A high voltage battery system 200 with a "floating ground" is shown in FIG. 2. Connected to the battery 201 and insulated from the chassis ground 202 are motors 205, 215 and 225. Generators 210 and auxiliary systems 220 are also connected to the battery 201 and insulated from the chassis ground 202. Actual capacitors and modeled capacitances 230 and 240 are either placed or may exist between terminals of the battery 201 and the chassis ground 202.

FIG. 3 shows a similar high voltage battery system 300 in which the positive terminal 310 of the battery 301 is connected via path 315 to the chassis 302. If an isolation fault 340 was to occur between the negative terminal 305 and the chassis 302, a short would be created between the battery terminals, causing fuses to blow and affecting vehicle safety.

Figure 4:
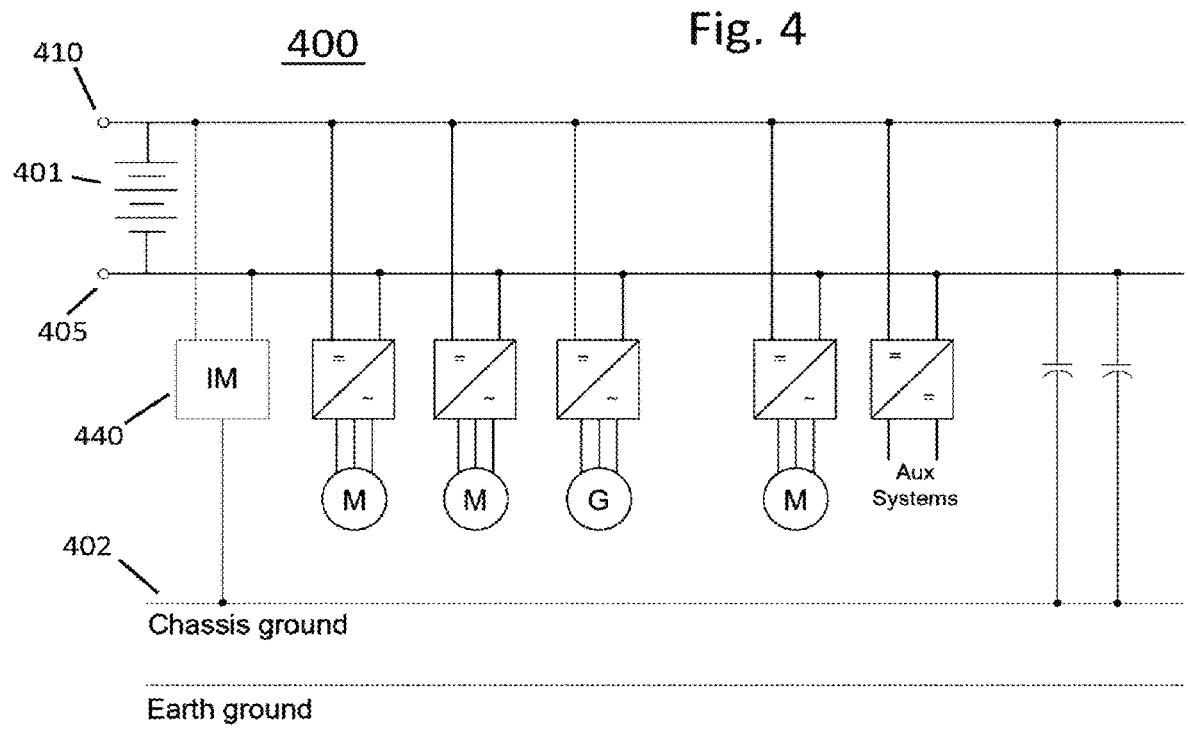
FIG. 4 illustrates an IT grounding system of an electric vehicle utilizing an Isolation Monitoring device.

An isolation monitoring system alerts the operator and responders to hazardous conditions that develop in an electrical system. FIG. 4 shows a high voltage battery system 400 containing an isolation monitoring device 440 according to the invention. The device 440 monitors the isolation resistance between the terminals 405 and 410 of the battery 401 and the chassis ground 402, and provides warnings of dangerous faults within the system during vehicle operation.

FIGS. 5A-5C illustrate an implementation of the "voltage" method in a high voltage battery system. In FIG. 5A, a battery 501 is isolated from the chassis ground 502. Resistances 550 and 560 represent the isolation resistances between the negative 515 and the positive 525 battery terminals to the chassis 502. Two voltmeters 555 and 565 measure the corresponding voltages $u_1$ and $u_2$. If there is a difference on the readings, a known resistance 570 is connected to the side with the higher voltage reading and, using Ohm's law, the smaller isolation resistance is calculated.

The method is illustrated in FIGS. 5B and 5C for either the case of $u_2>u_1$ or $u_1>u_2$, respectively.

An improvement over the "voltage" method, known as the "pulse" method, is shown in FIG. 6A-6C. FIG. 6A shows a DC network. In FIG. 6B, a pulse is injected into the DC network of FIG. 6A. The impedance is then determined by monitoring the response over time, as shown in FIG. 6C.

A variation of the "pulse" method, called the "frequency" injection method also exists. In this method, an AC signal of known frequency is injected or superimposed on the DC pulse. FIG. 7 illustrates superposition of DC and AC pulse injection on the network. Through band-pass and low-pass filtering of the resulting signal, the values of impedance and resistance are estimated using digital signal processing techniques.

FIG. 8A shows an example of widely varying battery voltage levels during operation of a Hybrid electric vehicle. The graph of FIG. 8A plots battery voltage over time under different load conditions. FIG. 8B is an illustration of a model used to represent the IT power system along with the isolation resistances and capacitances between the IT power system and the chassis ground.

Figure 9:
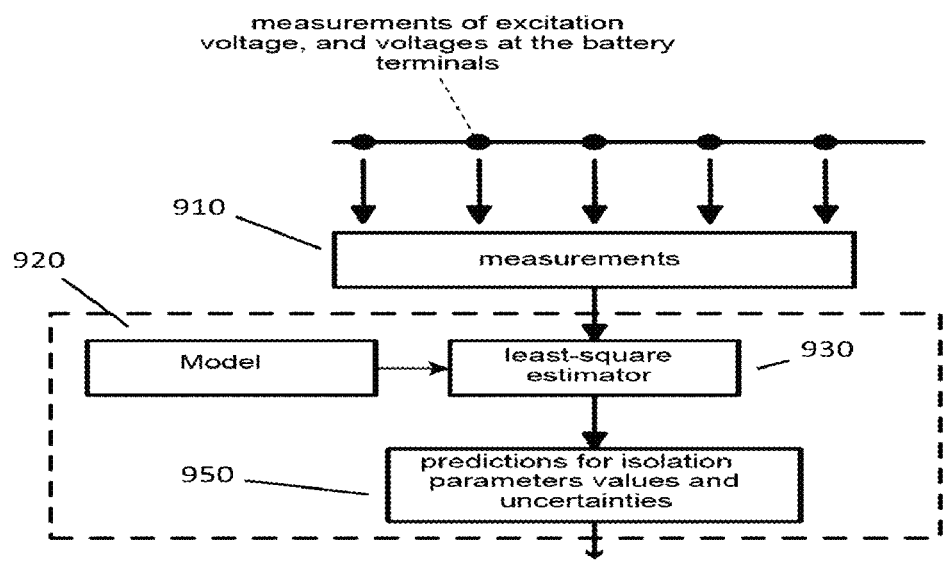
FIG. 9 shows a least-squared error method used to minimize the error between model predicted values of the isolation path and measurements.

An exemplary step of minimizing the deviation between measured and estimated values using a least-square estimator is shown in FIG. 9. In the figure, a predetermined number of voltage measurements 910 and a model for the isolation paths modeled as RC circuits 920 are entered into a least-square estimator 930. The least-square estimator function produces output predictions 950 for the isolation parameters values and uncertainties.

Figure 10:
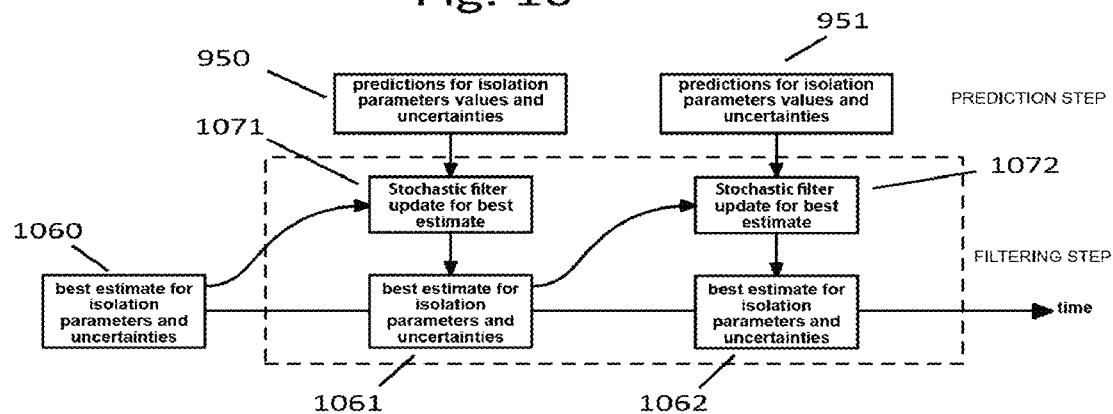
FIG. 10 is a schematic representation of the two-step process to estimate the isolation parameters and associated uncertainties.
Figure 11:
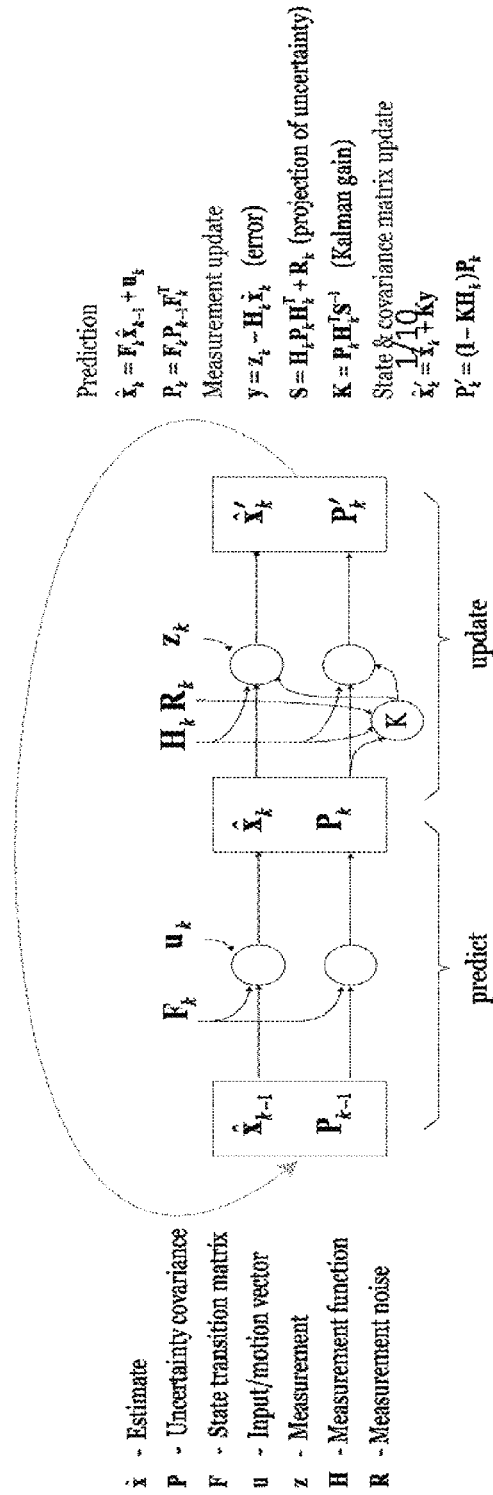
FIG. 11 shows a typical Kalman Filter implementation.

As shown in FIG. 10, output predictions 950 from the least-square estimator are used as inputs to a stochastic filter 1071. The stochastic filter 1071 may be, for example, a Kalman filter. The stochastic filter 1071 also receives as inputs best estimates 1060 for isolation parameters and uncertainties. Through its operation, the stochastic filter 1071 outputs new best estimates 1061 for isolation parameters and uncertainties. A second iteration of the stochastic filter 1072 receives updated output predictions 951 from the least-square estimator together with best estimates 1061 for isolation parameters and uncertainties. This second operation of the stochastic filter 1072 outputs new best estimates 1062 for isolation parameters and uncertainties. A detail of typical Kalman filter operation is shown in FIG. 11.

Figure 12:
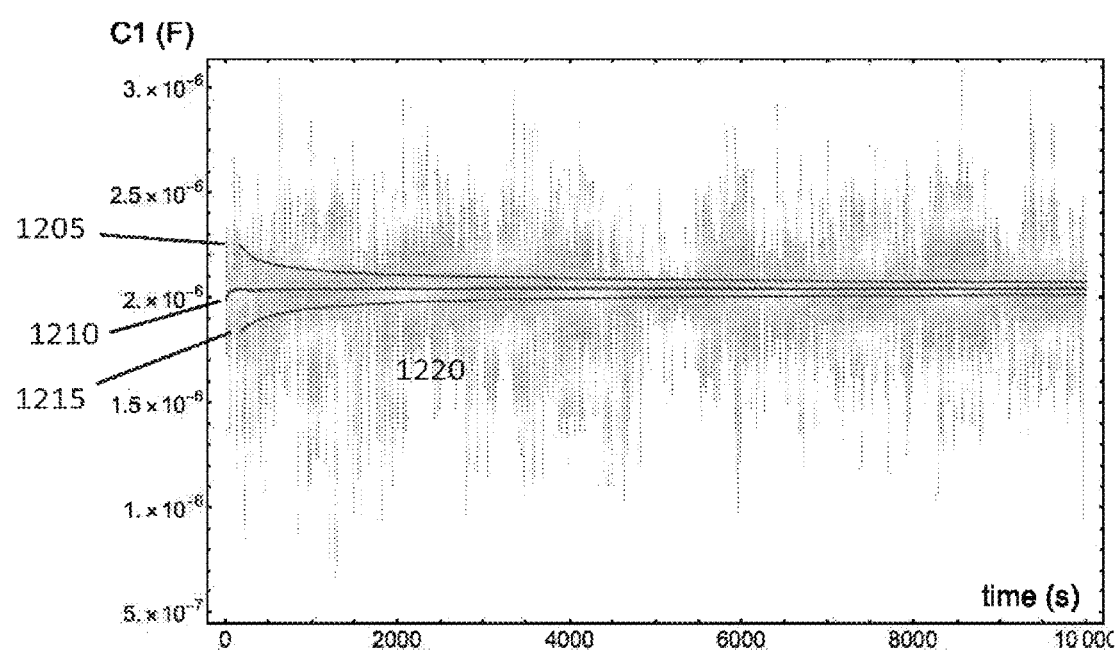
FIG. 12 is a plot of example results for the identification of isolation parameters according to the invention.

A graph of example results of the best estimate for the most likely value of capacitor $C_{y1}$ in the monitoring circuit is shown in FIG. 12. The best estimate is plotted as curve 1210 between curves 1205 and 1215, which themselves represent the narrowing confidence interval for the estimated value due to filtering. The unfiltered, noisy predictions from the least-square estimator are shown in the background as the widely varying curve 1220.

Figure 13:
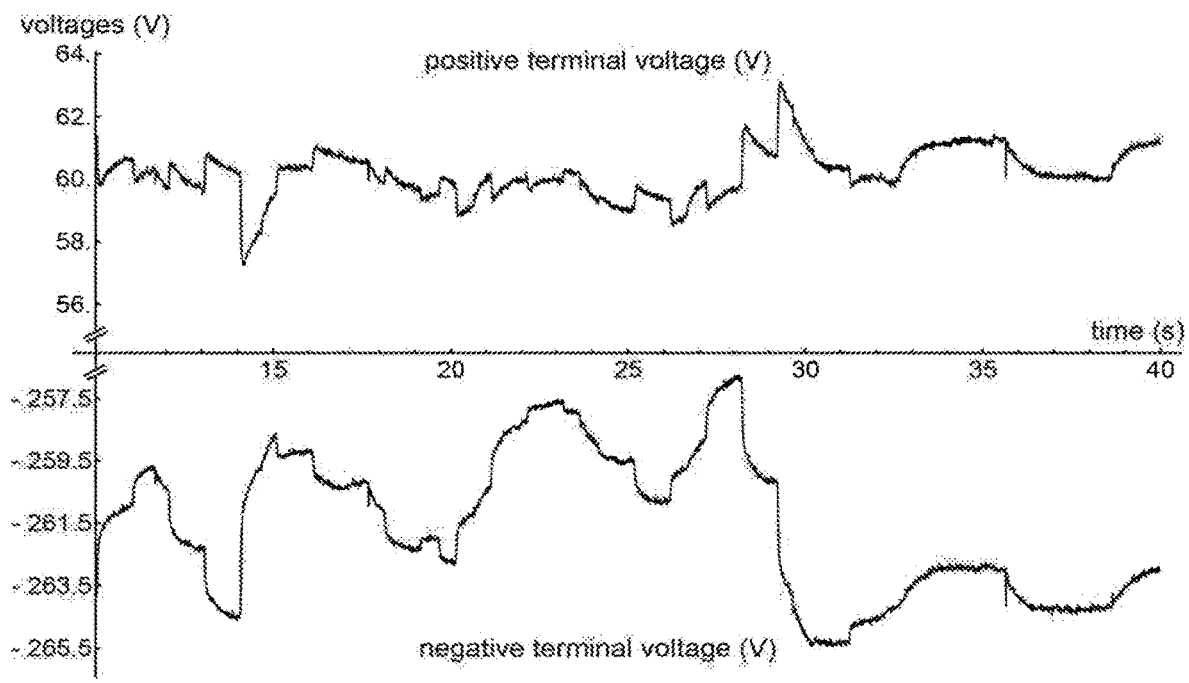
FIG. 13 is a plot of voltage waveforms at the two battery terminals in a device under test.
Figure 14:
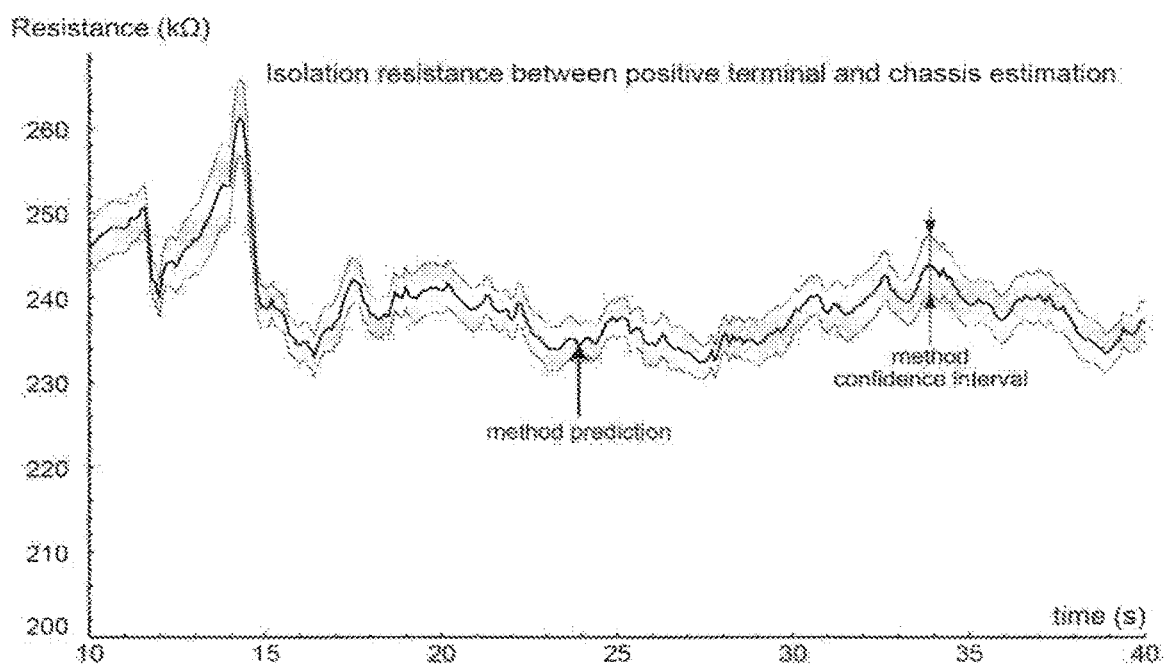
FIG. 14 shows an estimation of the isolation resistance between the positive terminal and chassis.
Figure 15:
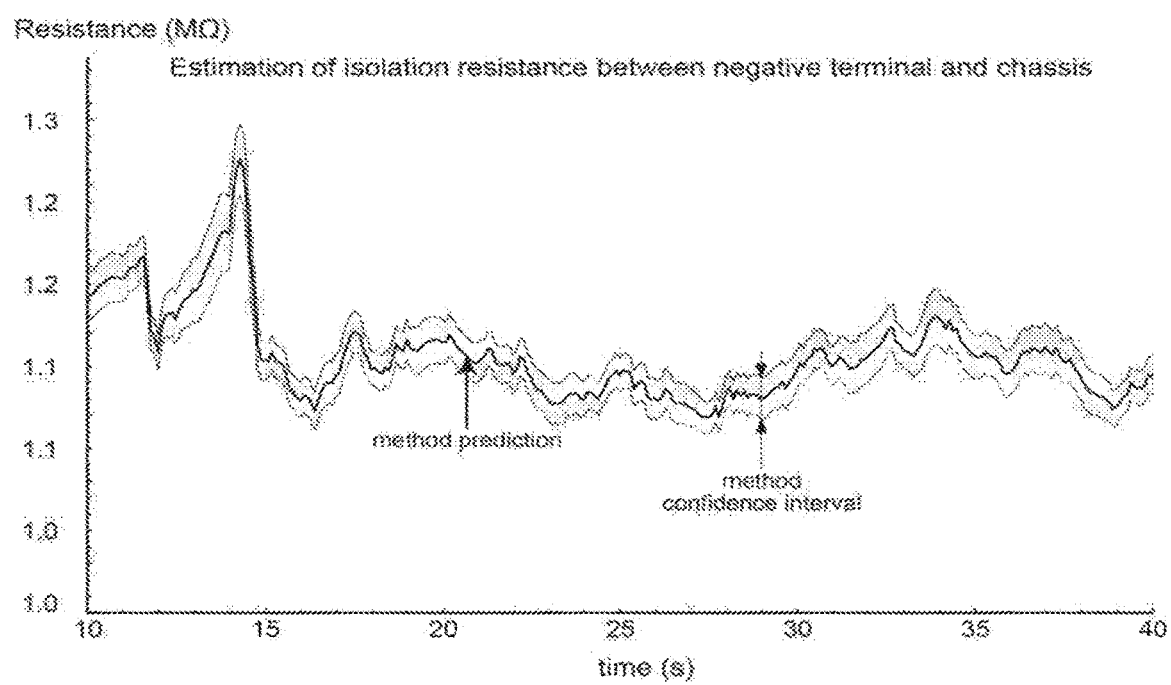
FIG. 15 shows an estimation of the isolation resistance between the negative terminal and chassis.
Figure 16:
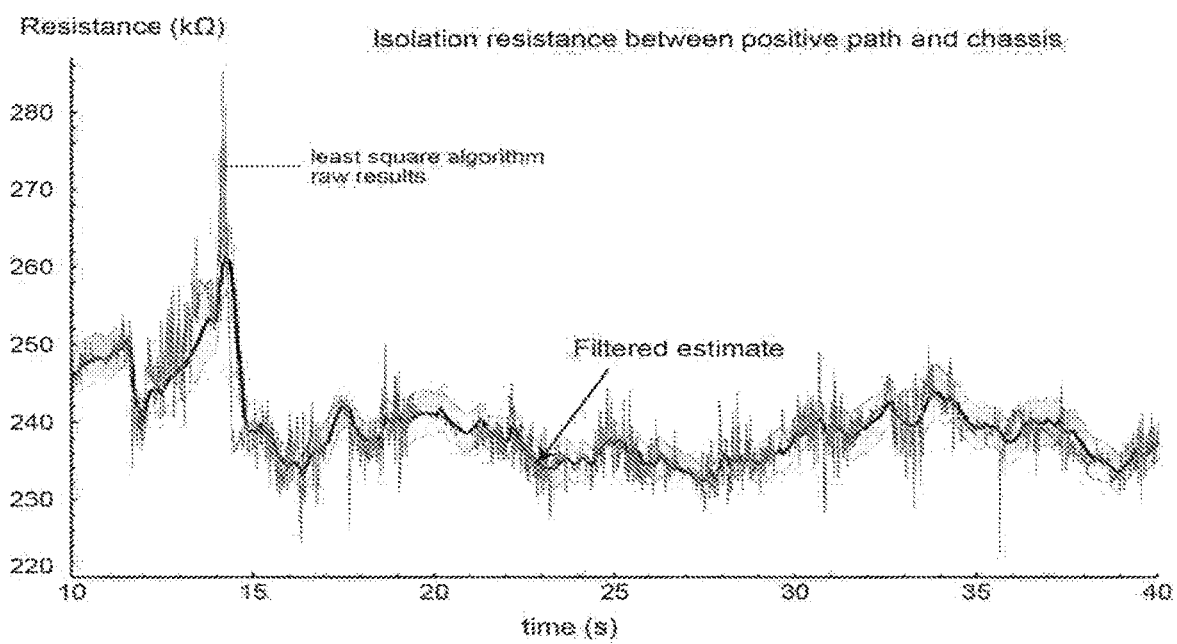
FIG. 16 displays the application of a Kalman filter on initially noisy data in providing the estimate of isolation resistance.

Voltage waveforms at the two battery terminals of the apparatus of FIG. 8B under test are shown in FIG. 13. Estimation of the isolation resistance between the positive terminal and the chassis is plotted in the graph of FIG. 14. Similarly, estimation of isolation resistance between the negative terminal and the chassis is plotted in the graph of FIG. 15. Both FIG. 14 and FIG. 15 show the method prediction as well as the method confidence interval under a varying load profile for a given period of time. The estimate of isolation resistance provided by a Kalman filter is shown together with the raw results of the least-squared algorithm in FIG. 16.

Figure 17:
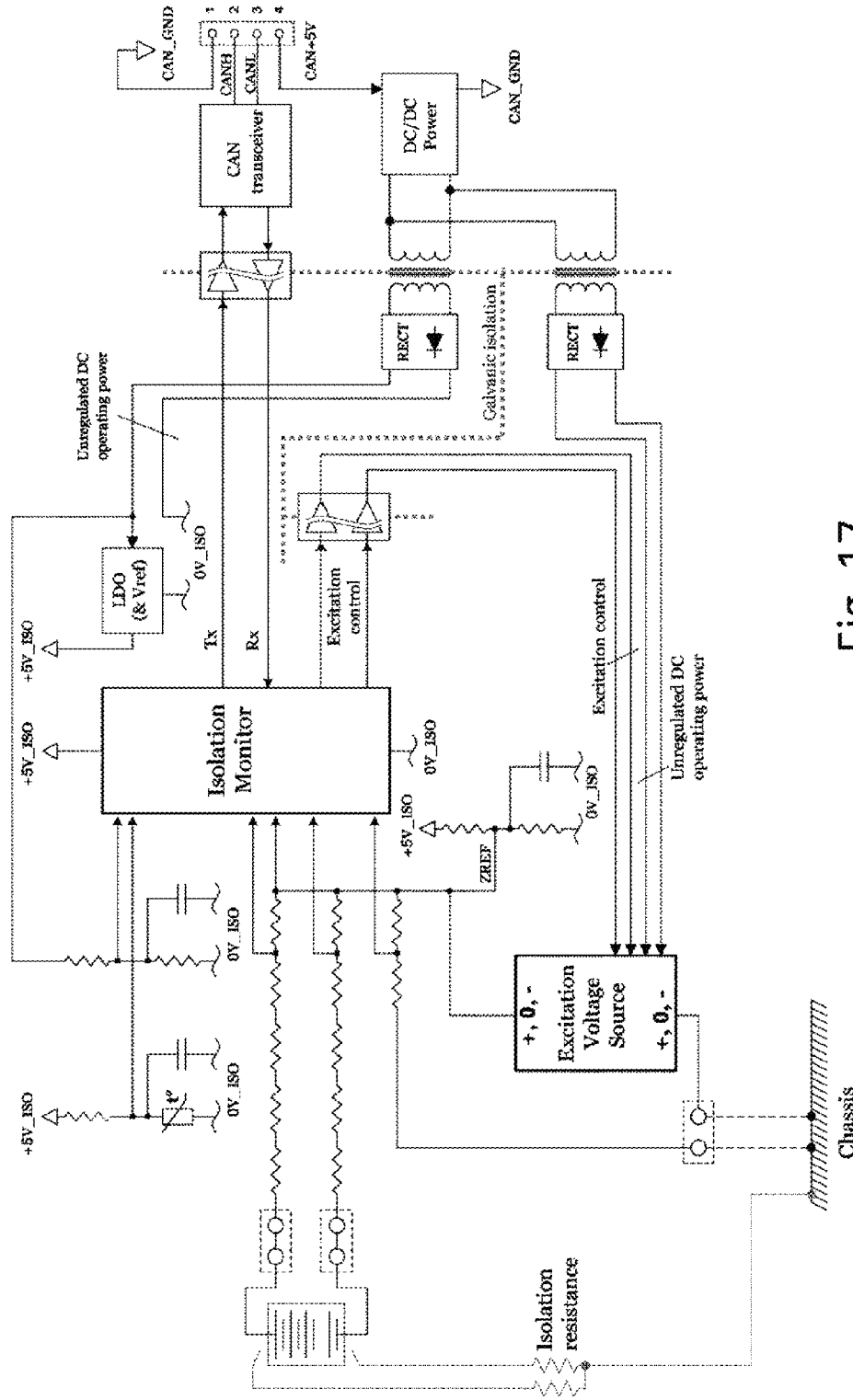
FIG. 17 is a block diagram of an isolation monitoring device as implemented in hardware.
Figure 18:
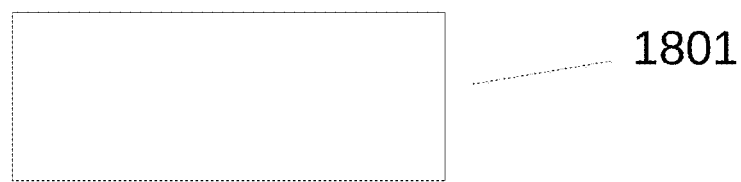
FIG. 18 shows a storage medium 1801.

A block diagram for the Isolation Measurement Device implemented in hardware is illustrated in FIG. 17.

What has been described is a method to estimate a change in values of isolation impedance in an isolated ground (IT) electrical system comprising a power source, the method comprising: modeling a first isolation path between a first reference point and a second reference point and modeling a second isolation path between a third reference point and a fourth reference point, thereby creating a theoretical model of the isolated ground electrical system; providing an initial value of a first isolation resistance for the first isolation path and an initial value of a second isolation resistance for the second isolation path; measuring an initial value of a voltage between the first reference point and the second reference point and storing the measured initial value in a storage medium; measuring an initial value of a voltage between the third reference point and the fourth reference point and storing the measured initial value in the storage medium; measuring a subsequent different value of the voltage between the first reference point and the second reference point and storing the measured subsequent value in the storage medium; measuring a subsequent value of the voltage between the third reference point and the fourth reference point and storing the measured subsequent value in the storage medium; entering the measured initial values of the voltages, the measured subsequent values of the voltages, the provided values of the isolation impedances and an elapsed amount of time between the initial measurements and the subsequent measurements into a mathematical function stored in the storage medium; wherein the mathematical function minimizes the discrepancy between the measured change in values of the voltages and the modeled theoretical values by adjusting values of modeled isolation impedances associated with the isolation paths in the electrical system; extracting estimated values of isolation impedances associated with the isolation paths in the electrical system by application of the mathematical function; and storing the estimated values in the storage medium.

Also described is an apparatus for estimating a change in values or unknown values of isolation impedance in an isolated ground (IT) electrical power system, comprising: a power source having a positive terminal and a negative terminal, said terminals connected in circuit to at least one additional electrical component and isolated from a chassis ground within the electrical system; wherein the electrical system contains an isolation impedance between each of the terminals and the chassis ground; a storage medium; means measuring an initial value and a subsequent different value of a voltage between the chassis ground and a first reference point and between a second reference point and a third reference point in the electrical system; means storing the measured initial values and the subsequent different values in the storage medium; a mathematical function stored in the storage medium, whereby application of the mathematical function extracts estimated values of isolation impedances associated with the voltage measurements by using a model of the electrical system and minimizing an error function.

Also described is a method to estimate unknown values of isolation impedance in an isolated ground (IT) electrical system comprising a power source and a load, the method comprising: modeling a first isolation path between a first reference point and a second reference point and modeling a second isolation path between a third reference point and a fourth reference point, thereby creating a theoretical model of the isolated ground electrical system; at a time when power from the power source is being dissipated in the load, measuring an initial value of a voltage between the first reference point and the second reference point and storing the measured initial value in a storage medium; at a time when power from the power source is being dissipated in the load, measuring an initial value of a voltage between the third reference point and the fourth reference point and storing the measured initial value in the storage medium; at a time when power from the power source is being dissipated in the load, measuring a subsequent different value of the voltage between the first reference point and the second reference point and storing the measured subsequent value in the storage medium; at a time when power from the power source is being dissipated in the load, measuring a subsequent value of the voltage between the third reference point and the fourth reference point and storing the measured subsequent value in the storage medium; entering the measured initial values of the voltages, the measured subsequent values of the voltages and an elapsed amount of time between the initial measurements and the subsequent measurements into a mathematical function stored in the storage medium; wherein the mathematical function minimizes the discrepancy between the measured initial values of the voltages, the measured subsequent values of the voltages, and the modeled theoretical values by adjusting values of modeled isolation impedances associated with the isolation paths in the electrical system; extracting estimated values of isolation impedance associated with the isolation paths in the electrical system by application of the mathematical function; identifying a minimum resistance path from the estimated values of isolation resistance; and storing the estimated values in the storage medium.

It will be appreciated that one skilled in the art of isolated ground electrical systems, varying output power sources and electrical systems could devise additional obvious improvements and variations upon the invention described and claimed herein. All such obvious improvements and variants are intended to be encompassed by the claims which follow.

The invention claimed is:

1. A method to estimate a change in values of isolation impedance in an isolated ground (IT) electrical system comprising a power source, the power source controllably connectable with first and second physical loads, the method comprising:
   modeling a first isolation path between a first reference point and a second reference point and modeling a second isolation path between a third reference point and a fourth reference point, thereby creating a theoretical model of the isolated ground electrical system;
   providing an initial value of a first isolation resistance for the first isolation path and an initial value of a second isolation resistance for the second isolation path;
   measuring an initial value of a voltage between the first reference point and the second reference point and storing the measured initial value in a storage medium;
   measuring an initial value of a voltage between the third reference point and the fourth reference point and storing the measured initial value in the storage medium;
   measuring a subsequent different value of the voltage between the first reference point and the second reference point and storing the measured subsequent value in the storage medium;
   measuring a subsequent value of the voltage between the third reference point and the fourth reference point and storing the measured subsequent value in the storage medium;
   the measuring of the initial values carried out under first physical load conditions;
   the measuring of the subsequent different values carried out under second physical load conditions;
   entering the measured initial values of the voltages, the measured subsequent values of the voltages, the provided values of the isolation impedances and an elapsed amount of time between the initial measurements and the subsequent measurements into a mathematical function stored in the storage medium;
   wherein the mathematical function minimizes the discrepancy between the measured change in values of the voltages and the modeled theoretical values by adjusting values of modeled isolation impedances associated with the isolation paths in the electrical system;
   extracting estimated values of isolation impedances associated with the isolation paths in the electrical system by application of the mathematical function;
   storing the estimated values in the storage medium; and
   in the event of an estimate a value of an isolation impedance falling below a predetermined threshold, annunciating the event to a human user;
   the method further comprising:
   extracting an estimated value of at least a first capacitance associated with an isolation path by application of the mathematical function and storing the estimated value in the storage medium;
   wherein the power source is a battery and the at least first reference point in the electrical system is a terminal of the battery;
   wherein the measured voltage values are measurements of a varying voltage within the electrical system while the electrical system is operating and measurements of a voltage signal source while the electrical system is idle;
   wherein the mathematical function stored in the storage medium is a least square estimator which produces a least squared error estimate;
   wherein the least squared error estimate is performed over a predetermined number of voltage measurements and corresponding voltage predictions, thereby minimizing a deviation between the measured voltage values and the estimated voltage values, and thereby producing a corresponding number of present value estimates and associated uncertainties for the present value estimates;
   wherein the method is performed iteratively;
   wherein the present value estimates are expressed as a vector and the associated uncertainties are expressed as a covariance matrix for the vector.

2. The method of claim 1, wherein the second reference point is a chassis ground of the electrical system.

3. The method of claim 2, wherein the fourth reference point is the chassis ground of the electrical system.

4. The method of claim 1, further comprising: comparing the estimated values of isolation resistance with a range of acceptable values and communicating that the estimated value of resistance for an isolation path is outside the range of acceptable values.

5. The method of claim 1, further comprising: communicating to a human user an amount of estimated energy stored in the isolation impedances.

6. The method of claim 1, wherein the power source is a battery and wherein the first reference point and the third reference point are positive and negative terminals of the battery.

7. The method of claim 1, wherein the power source is a supercapacitor.

8. The method of claim 1, wherein the power source is a DC charger.

9. The method of claim 1, further comprising: identifying a minimum resistance path from the estimated values of isolation resistance.

10. The method of claim 9, further comprising: communicating a value of resistance for the minimum resistance path in the electrical system.

11. The method of claim 9, wherein the power source comprises at least two power source terminals, the method further comprising: associating the minimum resistance path with one of the power source terminals.

12. The method of claim 1, wherein the theoretical model of the electrical system is an equivalent circuit model.

13. The method of claim 1, further comprising:
comparing the estimated values of capacitance with a range of acceptable values and communicating that the estimated value of the at least first capacitance is outside a range of acceptable values.

14. The method of claim 1, further comprising a stochastic filter, wherein the extracted estimated values are fed to the filter and the filter maintains the most likely present value estimates and associated uncertainties for the present value estimates.

15. The method of claim 14, wherein the stochastic filter is a Kalman filter.

16. The method of claim 15, further comprising:
receiving as inputs to the Kalman filter a set of previous present value estimates and associated uncertainties;
receiving as inputs to the Kalman filter a set of estimated values, including the estimated value of the resistance change and the estimated value of the capacitance change; outputting a new set of values for the most likely present value estimates and associated uncertainties by application of the filter; and
updating the present value estimates and associated uncertainties stored in the storage medium.

17. The method of claim 16, wherein the method is performed iteratively.

18. The method of claim 1 wherein the first and second loads are first and second motors, respectively.

19. A method to estimate a change in values of isolation impedance in an isolated ground (IT) electrical system comprising a power source and a load, the method comprising:
modeling a first isolation path between a first reference point and a second reference point and modeling a second isolation path between a third reference point and a fourth reference point, thereby creating a theoretical model of the isolated ground electrical system;
at a time when power from the power source is being dissipated in the load, measuring an initial value of a voltage between the first reference point and the second reference point and storing the measured initial value in a storage medium;
at a time when power from the power source is being dissipated in the load, measuring an initial value of a voltage between the third reference point and the fourth reference point and storing the measured initial value in the storage medium;
at a time when power from the power source is being dissipated in the load, measuring a subsequent different value of the voltage between the first reference point and the second reference point and storing the measured subsequent value in the storage medium;
at a time when power from the power source is being dissipated in the load, measuring a subsequent value of the voltage between the third reference point and the fourth reference point and storing the measured subsequent value in the storage medium;
entering the measured initial values of the voltages, the measured subsequent values of the voltages and an elapsed amount of time between the initial measurements and the subsequent measurements into a mathematical function stored in the storage medium; wherein the mathematical function minimizes the discrepancy between the measured initial values of the voltages, the measured subsequent values of the voltages and the modeled theoretical values by adjusting values of modeled isolation impedances associated with the isolation paths in the electrical system;
extracting estimated values of isolation impedances associated with the isolation paths in the electrical system by application of the mathematical function; and
storing the estimated values in the storage medium; and
in the event of an estimate a value of an isolation impedance falling below a predetermined threshold, annunciating the event to a human user;
the method further comprising: extracting an estimated value of at least a first capacitance associated with an isolation path by application of the mathematical function and storing the estimated value in the storage medium;
wherein the power source is a battery and the at least first reference point in the electrical system is a terminal of the battery;
wherein the measured voltage values are measurements of a varying voltage within the electrical system while the electrical system is operating and measurements of a voltage signal source while the electrical system is idle;
wherein the mathematical function stored in the storage medium is a least square estimator which produces a least squared error estimate;
wherein the least squared error estimate is performed over a predetermined number of voltage measurements and corresponding voltage predictions, thereby minimizing a deviation between the measured voltage values and the estimated voltage values, and thereby producing a corresponding number of present value estimates and associated uncertainties for the present value estimates;
wherein the method is performed iteratively;
wherein the present value estimates are expressed as a vector and the associated uncertainties are expressed as a covariance matrix for the vector;
further comprising a stochastic filter, wherein the extracted estimated values are fed to the filter and the filter maintains the most likely present value estimates and associated uncertainties for the present value estimates.

20. The method of claim 19, wherein the second reference point is a chassis ground of the electrical system.

21. The method of claim 20, wherein the fourth reference point is the chassis ground of the electrical system.

22. The method of claim 19, further comprising: comparing the estimated values of isolation resistance with a range of acceptable values and communicating that the estimated value of resistance for an isolation path is outside the range of acceptable values.

23. The method of claim 19, further comprising: communicating to a human user an amount of estimated energy stored in the isolation impedances.

24. The method of claim 19, wherein the power source is a battery and wherein the first reference point and the third reference point are positive and negative terminals of the battery.

25. The method of claim 19, wherein the power source is a supercapacitor.

26. The method of claim 19, wherein the power source is a DC charger.

27. The method of claim 26, further comprising: identifying a minimum resistance path from the estimated values of isolation resistance.

28. The method of claim 27, further comprising: communicating to a human user a value of resistance for the minimum resistance path in the electrical system.

29. The method of claim 27, wherein the power source comprises at least two power source terminals, the method further comprising: associating the minimum resistance path with one of the power source terminals.

30. The method of claim 19, wherein the theoretical model of the electrical system is an equivalent circuit model.

31. The method of claim 19, further comprising: comparing the estimated values of capacitance with a range of acceptable values and communicating that the estimated value of the at least first capacitance is outside a range of acceptable values.

32. The method of claim 19, wherein the stochastic filter is a Kalman filter.

33. The method of claim 32, further comprising:
   receiving as inputs to the Kalman filter a set of previous present value estimates and associated uncertainties;
   receiving as inputs to the Kalman filter a set of estimated values, including the estimated value of the resistance change and the estimated value of the capacitance change; outputting a new set of values for the most likely present value estimates and associated uncertainties by application of the filter; and
   updating the present value estimates and associated uncertainties stored in the storage medium.

34. The method of claim 33, wherein the method is performed iteratively.

* * * * *